United States Patent
Chen et al.

(10) Patent No.: US 10,095,476 B2
(45) Date of Patent: Oct. 9, 2018

(54) RANDOM TELEGRAPH NOISE NATIVE DEVICE FOR TRUE RANDOM NUMBER GENERATOR AND NOISE INJECTION

(71) Applicant: International Business Machines Corporation, Armonk, NY (US)

(72) Inventors: Chia-yu Chen, White Plains, NY (US); Damon Farmer, White Plains, NY (US); Suyog Gupta, White Plains, NY (US); Shu-jen Han, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 230 days.

(21) Appl. No.: 14/957,227

(22) Filed: Dec. 2, 2015

(65) Prior Publication Data

US 2017/0161022 A1    Jun. 8, 2017

(51) Int. Cl.
*G06F 7/58* (2006.01)
*H01L 29/423* (2006.01)

(52) U.S. Cl.
CPC ........ *G06F 7/582* (2013.01); *H01L 29/42324* (2013.01)

(58) Field of Classification Search
CPC ................. G06F 7/588; H01L 29/4234; H01L 29/42344; H01L 29/42348; H01L 29/42352
USPC ........................................................ 708/250
See application file for complete search history.

(56) References Cited

U.S. PATENT DOCUMENTS

| | | | |
|---|---|---|---|
| 6,919,579 B2 | 7/2005 | Amin et al. | |
| 8,346,832 B2 | 1/2013 | Mudge et al. | |
| 8,650,233 B2 | 2/2014 | Ikegami et al. | |
| 9,075,675 B2 | 7/2015 | Liu et al. | |
| 2007/0296025 A1* | 12/2007 | Matsumoto | G06F 7/588 257/324 |
| 2008/0301210 A1 | 12/2008 | Dover | |
| 2014/0136583 A1 | 5/2014 | Hyde et al. | |
| 2015/0054548 A1* | 2/2015 | Kato | H01L 21/28282 326/55 |
| 2015/0100614 A1* | 4/2015 | Ueda | H03K 3/84 708/250 |
| 2015/0154006 A1 | 6/2015 | Yang et al. | |

(Continued)

OTHER PUBLICATIONS

Michael E. Auer, Basics in Systems and Circuits Theory, The McGraw-Hill Companies, Jan. 11, 2011, pp. 1-52.*

(Continued)

*Primary Examiner* — Michael D. Yaary
(74) *Attorney, Agent, or Firm* — Abdy Raissinia, Esq.; McGinn IP Law Group, PLLC

(57) ABSTRACT

A method (and system) for generating random numbers includes setting a drain voltage Vd on an MOSFET device to maximize a transconductance of the MOSFET device and setting a gate voltage Vg of the MOSFET device to tune as desired a random number statistical distribution of an output of the MOSFET device. The MOSFET device includes a gate structure with an oxide layer including at least one artificial trapping layer in which carrier traps are designed to occupy a predetermined distance from conduction and valance bands of material of the artificial trapping layer.

8 Claims, 6 Drawing Sheets

(56) References Cited

U.S. PATENT DOCUMENTS

2015/0193204 A1 7/2015 Lin et al.
2015/0268934 A1* 9/2015 Anderson ............... G06F 7/588
708/250

OTHER PUBLICATIONS

E. Sijercic, Simulation of the exclusion/extraction InSb MOSFETs, IEEE, Apr. 16, 2004, pp. 67-70.*
Brederlow, et al., "A Low-Power True Random Number Generator Using the Random Telegraph Noise of Single Oxide-Traps," ISSCC Dig. Tech. Papers, pp. 1666-1675, Feb. 2006.
Huang et al. "A Contact-Resistive Random-Access-Memory Based True Random Number Generator", IEEE Electron Device Letters, vol. 13 No. 8, pp. 1108-1110, Aug. 2012.
Kinniment et al "Design of an On-Chip Random Number Generator using Metastability", Proc Proc European Solid-State circuit conf., pp. 595-598 Sep. 2002.

* cited by examiner

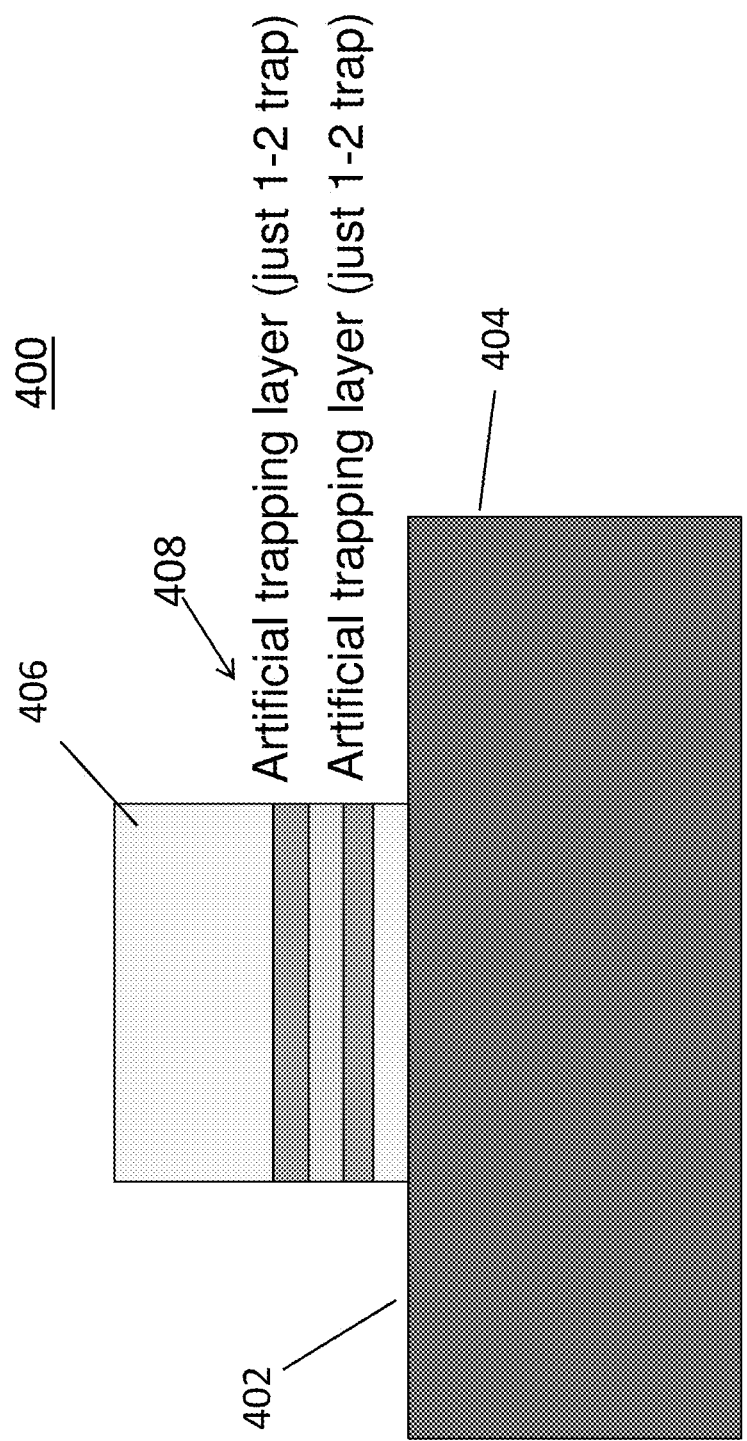

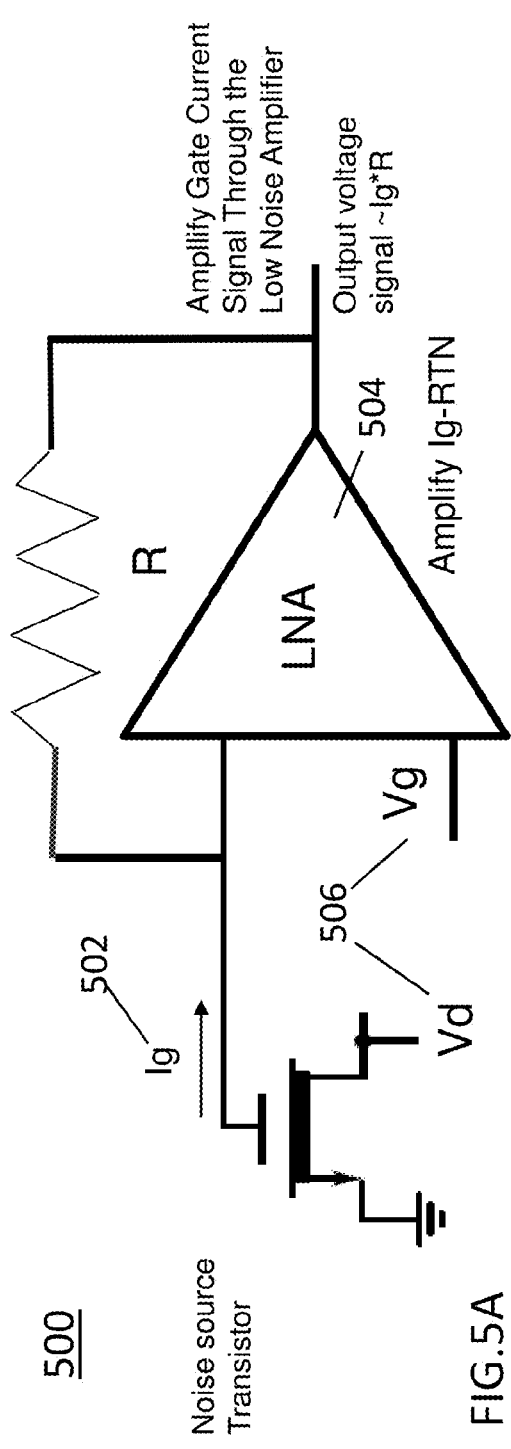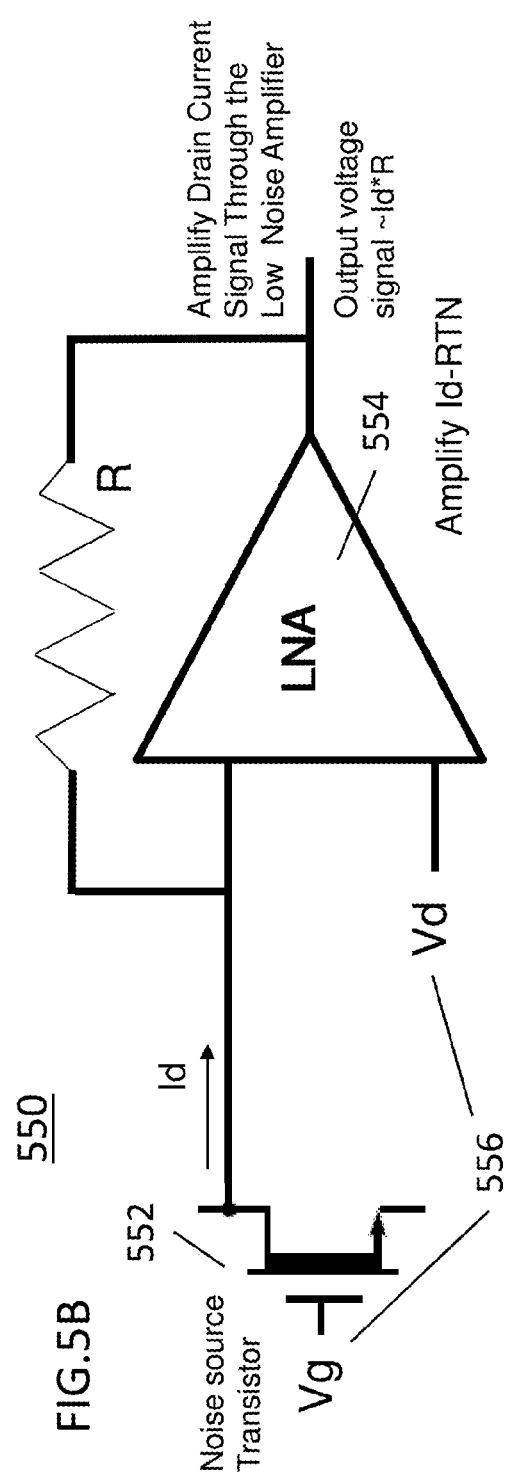
FIG.5A
FIG.5B

RANDOM TELEGRAPH NOISE NATIVE DEVICE FOR TRUE RANDOM NUMBER GENERATOR AND NOISE INJECTION

BACKGROUND OF THE INVENTION

Field of the Invention

The present invention generally relates to a device for generating true random numbers. More particularly, artificial traps are created in a native device for different random number generations and voltage is used to tune the tunneling time of trapping/detrapping, and the native device is biased to maximize the trapping/detrapping impacts so as to amplify the random noise.

Description of the Related Art

In recent years, stochastic circuits have become important because they are used in many applications, including for example, security encryption and accelerators for neural networks. Additionally, probability representations made a lot of random numbers. And, noise injection is an important nub for Bayesian learning. However, the probability density function (PDF) of random numbers should be controlled. Probability some and product should be implemented efficiently. Conditional probabilities should be generated efficiently. Existing solutions for random noise generation often uses noise sources from thermal noise, random telegraph noise (RTN), or other entropy sources. The system is tuned to statistics and then generate random numbers. FIG. 1A shows an exemplary conventional random number generator circuit 100.

This conventional circuit 100 has several problems. First, there is no direct control in the entropy source. Second, because of the small noise generator 102, a relatively large and complicated system is required, including, for example, a relatively large analog-to-digital (AC) circuit 104 comprising an amplifier, filter, and comparator, which increases area and cost.

SUMMARY OF THE INVENTION

In view of the foregoing and other problems and concerns, the present invention provides a device and circuit for generating random numbers, in which artificial traps are engineered and which have a controlled tuning process to generate the random numbers. The native devices of the present invention can be customized MOS (Metal Oxide Semiconductor). The traps can be generated through STM (scanning tunneling microscopy), quantum dots, or nanocrystalline deposition.

In a first exemplary aspect of the present invention, described herein is a random telegraph noise native device including a source region, a drain region, and a gate structure formed between the source and drain regions, wherein the gate structure includes an oxide layer comprising at least one artificial trapping layer in which carrier traps are designed to occupy a predetermined distance from conduction and valance bands of material of the artificial trapping layer.

In a second exemplary aspect, the present invention provides a method for a random number generator that can be tuned for specific random number statistical characteristics.

These and many other advantages may be achieved with the present invention.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 4 shows exemplarily a MOS-type device 200 having at least one trapping layer 206 in the gate oxide structure 204;

FIG. 5A illustrates an exemplary embodiment 500 of a noise generator circuit of the present invention using Ig-RTN;

FIG. 5B illustrates an exemplary embodiment 550 of a noise generator circuit of the present invention using Id-RTN.

DETAILED DESCRIPTION OF EXEMPLARY EMBODIMENTS OF THE INVENTION

Figure 1A:
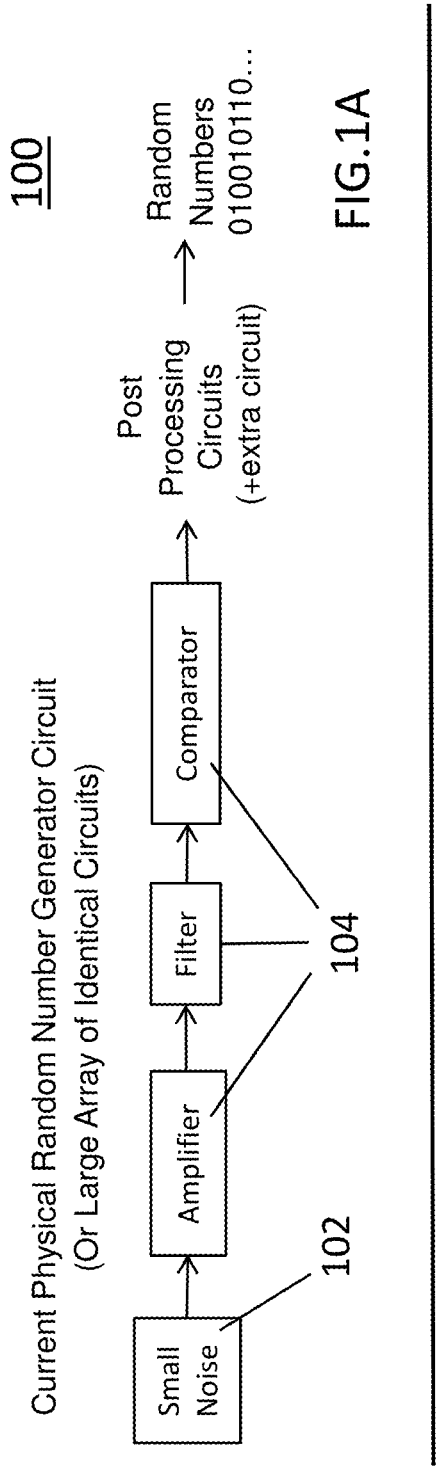
FIG. 1A illustrates an exemplary conventional random number generator that uses a small noise source that requires a relatively large amplifier and filter circuits.

Referring now to the drawings, and more particularly to FIGS. 1B-6, exemplary embodiments of the method and structures of the present invention will now be described.

Figure 1B:
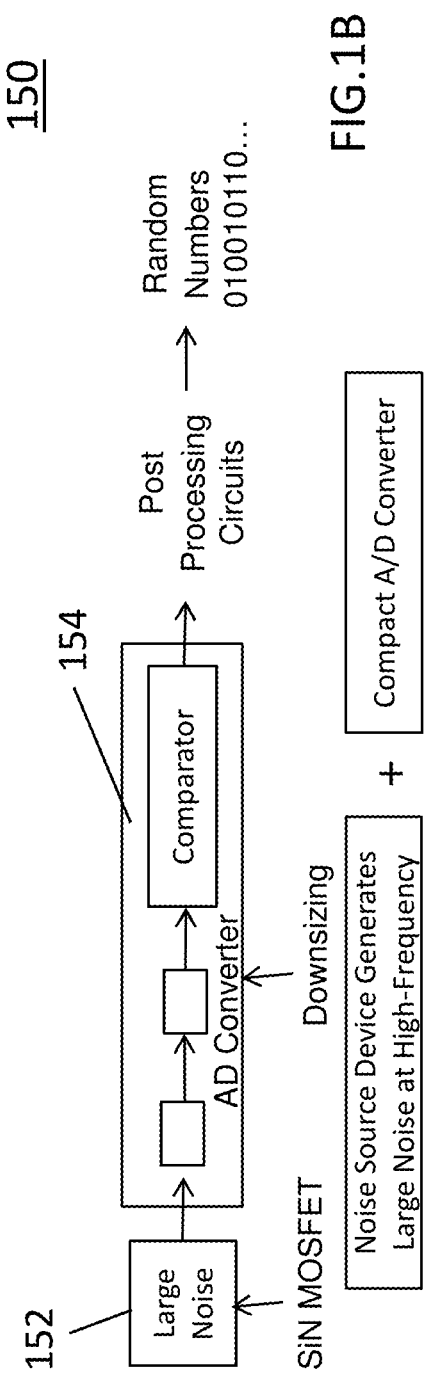
FIG. 1B illustrates a comparable circuit of an exemplary embodiment of the present invention, using a relatively smaller amplifier and filter circuits.

As shown exemplarily in FIG. 1B, an exemplary embodiment of the present invention uses a large noise source device 152, which generates large noise at high frequency, which, in turn, permits a smaller amplifier and filter for the A/D converter 154. These smaller dimensions for the A/D converter downsize the circuit area of the present invention to 1200 mm$^2$, which provides a savings in circuit area of the conventional circuit 100 shown in FIG. 1A.

The large noise source 152 of the present invention uses native device trapping, which will be explained shortly.

Figure 2:
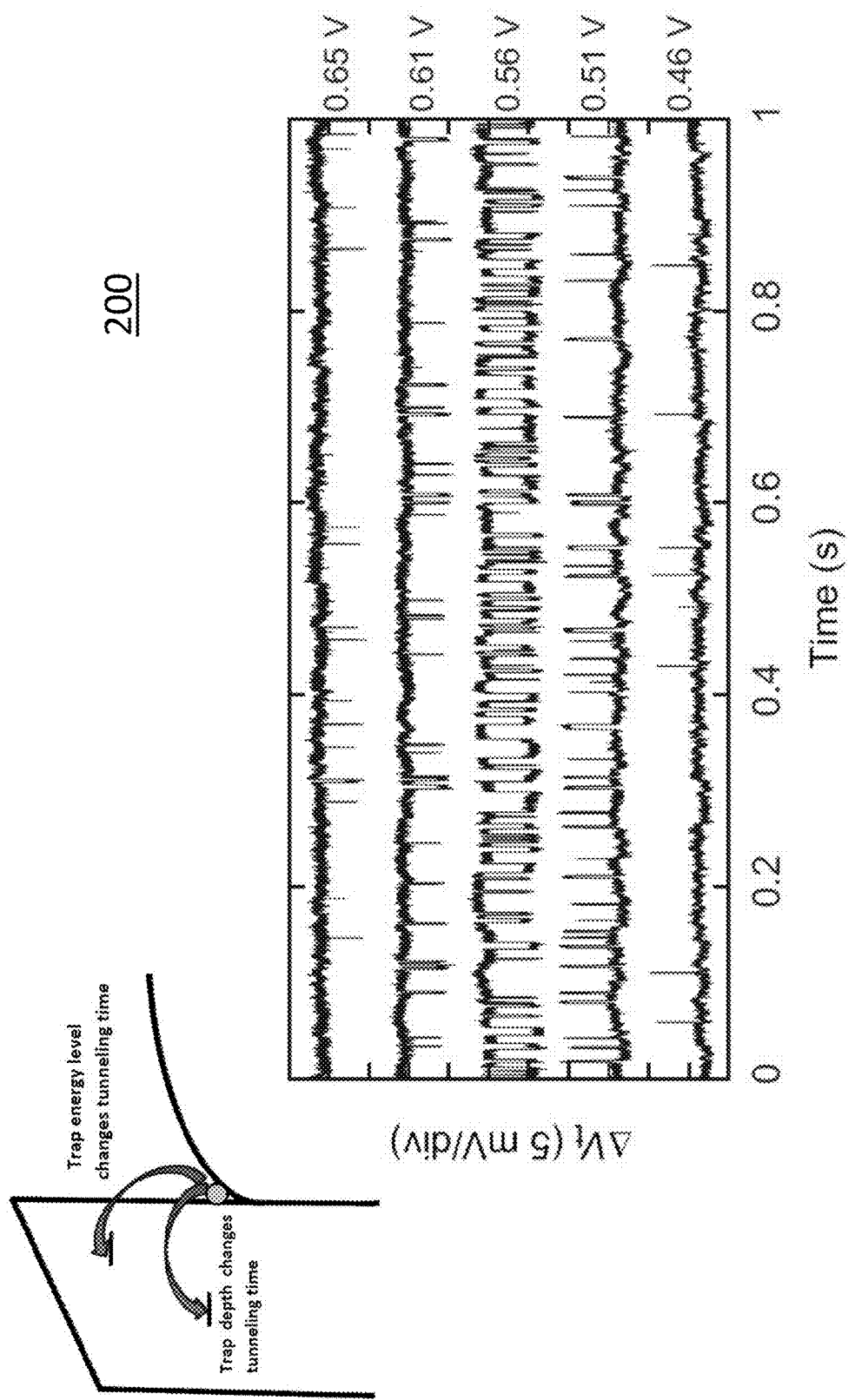
FIG. 2 shows exemplarily the concept of controlling tunneling time 200.

FIG. 2 shows exemplarily the concept of controlling of tunneling time. On the left side is shown how different trap depths change tunneling times, which aspect provides different noise signals shown on the right side of FIG. 2. There are several different parameters known in the art to control tunneling time, including temperature, voltage, and oxide layer composition (e.g., high K or other material). Prior art methods relied upon temperature for changing tunnel times. In contrast, the present invention uses voltage to change tunneling time and engineer the random variable shown on the right side of FIG. 2.

Figure 3:
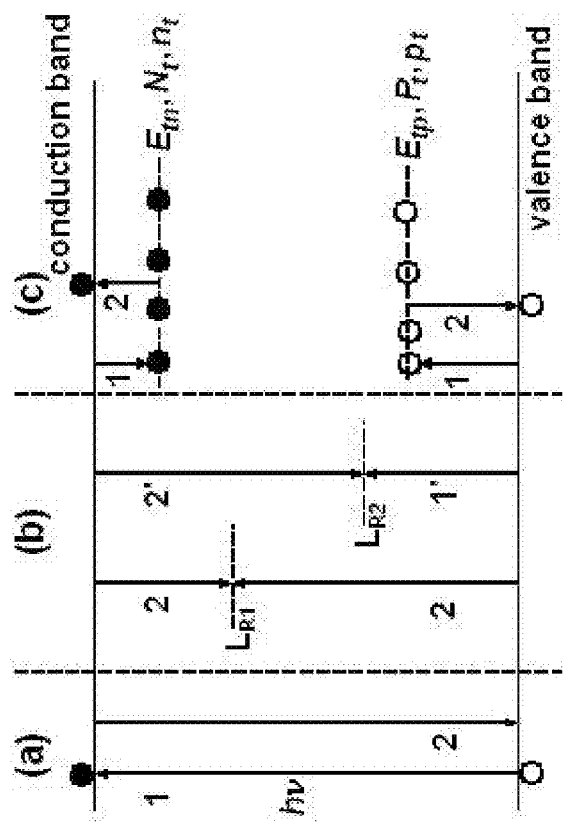
FIG. 3 shows exemplarily the concept of artificial traps 300 for noise engineering.

FIG. 3 shows exemplarily how artificial traps can be engineered to control tunneling time by change location of the traps relative to the conduction and valence bands; the closer the traps are located to the conduction and valence bands, the more often emissions occur.

FIG. 4 shows exemplarily an MOS-type RTN native device 400 having source/drain 402, 404 and gate structure 406 with at least one artificial trapping layer 408 in the gate oxide.

Such MOS-type structure 400 permits small capacitance for trapping, $\Delta Q = C \Delta V$. In most implementations of the present invention, the traps will be intentionally created close to Ef. There can be multiple artificial trapping layers 408, or only a single artificial trapping layer, in the gate oxide. With single trap layer, the output can only have two different states. With multiple layers, the output can have more than two states, which feature enhances the information (data) delivered from the same amount of devices. The MOS structure permits small width and short channel, which is ideal for high density circuit integration.

The artificial trapping layer(s) 408 can exemplarily be fabricated by such any method that permits traps to be selectively located relative to the conduction and valence bands. For example, high density Ru nanocrystals can be deposited, much as currently done for non-volatile memory applications. Other methods such as STM (scanning tunnel microscopy), quantum dots, other nanocrystal deposition can be used for generating the artificial trapping layer(s).

FIG. 5A shows exemplarily how the MOS RTN native device 502 is connected to provide Ig as an output signal for low noise amplifier (LNA) 504 to provide output signal Ig*R, where R is the feedback resistance of the LNA. The control parameters 506 are voltages Vd and Vg.

FIG. 5B shows how the RTN native device 552 is connected to provide Id as input into LNA 554, and control parameters 556 are again Vd and Vg. The output signal in this configuration is Id*R.

Figure 6:
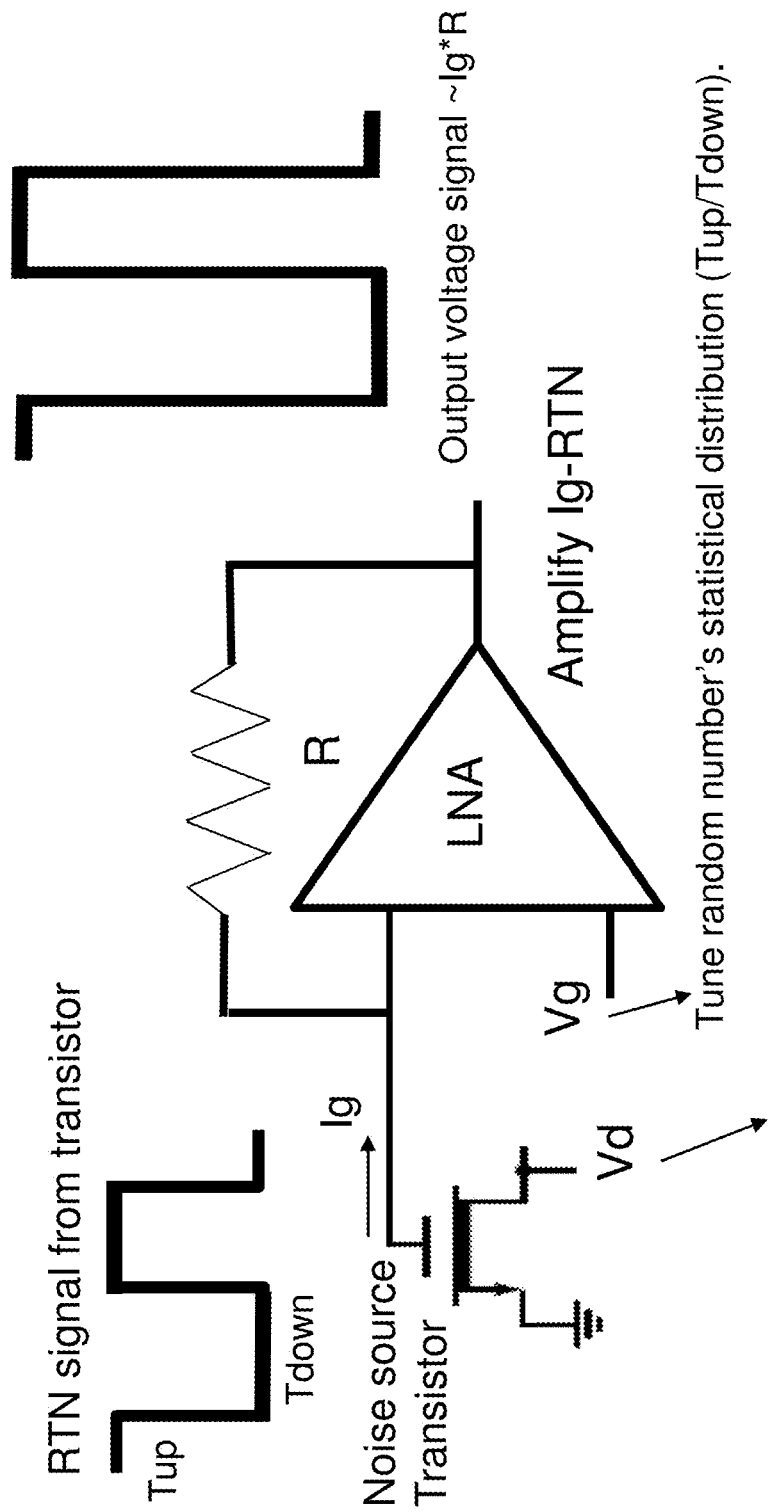
FIG. 6 illustrates how the random noise generator circuits of the present invention can be selectively biased and tuned.

FIG. 6 shows details related to the control parameters Vd and Vg shown in FIGS. 5A and 5B. Thus, as shown in FIG. 6, the circuit of FIG. 5A can be controlled by biasing the noise-source transistor to be in the maximum gm regime, meaning that Vd is chosen to maximize gm. To modify the random number behavior, the statistical distribution, Vg is chosen to tune the tunneling time and thereby control the random variable's probability function.

While the invention has been described in terms of several exemplary embodiments, those skilled in the art will recognize that the invention can be practiced with modification.

Further, it is noted that, Applicants' intent is to encompass equivalents of all claim elements, even if amended later during prosecution.

What is claimed is:

1. A semiconductor device, comprising:
   a substrate;
   a metal oxide semiconductor (MOS) device comprising:
      a source region and a drain region embedded in said substrate; and
      a gate structure formed between said source and drain regions, said gate structure comprising an oxide layer comprising at least one artificial trapping layer in which carrier traps are designed to occupy a predetermined distance from conduction and valance bands of material of said artificial trapping layer;
   an operational amplifier formed on said substrate; and
   a resistance R interconnected between a first input terminal and an output terminal of said operational amplifier, such that said operational amplifier and resistor thereby forms a low noise amplifier for said MOS device,
   wherein an amount of a gate current Ig of said MOS device passes through said resistance R, so that an output voltage of said low noise amplifier V=Ig*R, and wherein a voltage at a second input terminal of said operational amplifier sets a voltage Vg for said gate of said MOS structure, and
   wherein a voltage at said drain of said MOS is set at a voltage value predetermined to maximize a transconductance gm of said MOS device and wherein Vg is selectively set to tune a random number statistical distribution of voltage values of said output voltage of said operational amplifier.

2. The semiconductor device of claim 1, wherein each of said at least one trapping layer is fabricated using one of nanocrystal deposition, scanning tunnel microscopy, E-beam, and quantum dots formation.

3. A semiconductor device, comprising:
   a substrate;
   a metal oxide semiconductor (MOS) device comprising:
      a source region and a drain region embedded in said substrate; and
      a gate structure formed between said source and drain regions, said gate structure comprising an oxide layer comprising at least one artificial trapping layer in which carrier traps are designed to occupy a predetermined distance from conduction and valance bands of material of said artificial trapping layer;
   an operational amplifier formed on said substrate; and
   a resistance R interconnected between a first input terminal and an output terminal of said operational amplifier, such that said operational amplifier and resistor thereby forms a low noise amplifier for said MOS device,
   wherein an amount of a drain current Id of said MOS device passes through said resistance R, so that an output voltage of said low noise amplifier V=Id*R, and wherein a voltage at a second input terminal of said operational amplifier sets a voltage Vd for said drain of said MOS structure, and
   wherein said voltage Vd at said drain of said MOS is set at a voltage value predetermined to maximize a transconductance gm of said MOS device and wherein Vg is selectively set to tune a random number statistical distribution of voltage values of said output voltage of said operational amplifier.

4. The semiconductor device of claim 3, wherein each of said at least one trapping layer is fabricated using one of nanocrystal deposition, scanning tunnel microscopy, E-beam, and quantum dots formation.

5. A method of generating random numbers, said method comprising:
   setting a drain voltage Vd on an MOSFET (metal oxide semiconductor field effect transistor) device to maximize a transconductance of said MOSFET device; and
   setting a gate voltage Vg of said MOSFET device to tune as desired a random number statistical distribution of an output of said MOSFET device,
   wherein said MOSFET device comprises a gate structure comprising an oxide layer including at least one artificial trapping layer in which carrier traps are designed to occupy a predetermined distance from conduction and valance bands of material of said artificial trapping layer.

6. The method of claim 5, wherein each of said at least one trapping layer is fabricated using one of nanocrystal deposition, scanning tunnel microscopy, E-beam, and quantum dots formation.

7. The method of claim 5, wherein an output voltage of said MOSFET is provided as an input signal into a low noise amplifier.

8. The method of claim 7, wherein said low noise amplifier comprises a component of an analog-to-digital (A/D) converter.

* * * * *